United States Patent [19]

Allen et al.

[11] Patent Number: 5,665,527
[45] Date of Patent: Sep. 9, 1997

[54] PROCESS FOR GENERATING NEGATIVE TONE RESIST IMAGES UTILIZING CARBON DIOXIDE CRITICAL FLUID

[75] Inventors: Robert David Allen, San Jose; Gregory Michael Wallraff, Morgan Hill, both of Calif.

[73] Assignee: International Business Machines Corporation, Armonk, N.Y.

[21] Appl. No.: 794,135

[22] Filed: Feb. 3, 1997

Related U.S. Application Data

[63] Continuation of Ser. No. 390,613, Feb. 17, 1995, abandoned.

[51] Int. Cl.⁶ .................................................. G03F 7/36
[52] U.S. Cl. ......................... 430/325; 430/311; 430/331
[58] Field of Search ............................. 430/325, 331, 430/311; 437/229

[56] References Cited

U.S. PATENT DOCUMENTS

| | | | |
|---|---|---|---|
| 4,491,628 | 1/1985 | Ito et al. | 430/176 |
| 4,552,833 | 11/1985 | Ito et al. | 430/325 |
| 4,944,837 | 7/1990 | Nishikawa et al. | 156/646 |
| 5,071,730 | 12/1991 | Allen et al. | 430/270 |
| 5,185,296 | 2/1993 | Morita et al. | 437/229 |

OTHER PUBLICATIONS

O'Brien, "Novolac-based Photoresists Combining Chemical Amplification and Dissolution Inhibition", Polymer Engineering and Science, vol. 29, No. 13, Mid-Jul. 1989, pp. 846-849.

Reichmanis et al., "A Novel Approach to c-nitrobenzyl Photochemistry for Resists", Journal of Vacuum Science Technology, vol. 19, No. 4, Nov./Dec. 1981, pp. 1338-1342.

*Primary Examiner*—Christopher G. Young
*Attorney, Agent, or Firm*—Robert B. Martin

[57] ABSTRACT

The invention relates to a process for generating a negative tone resist image comprising the steps of (1) coating a substrate with a film of a polymeric composition comprising (i) a polymer, (ii) a photosensitive acid generator, and (iii) acid labile groups; (2) imagewise exposing the film to radiation to generate free acid; and (3) developing the image with critical fluid.

6 Claims, No Drawings

PROCESS FOR GENERATING NEGATIVE TONE RESIST IMAGES UTILIZING CARBON DIOXIDE CRITICAL FLUID

This is a continuation of application Ser. No. 08/390,613 filed on Feb. 17, 1995, now abandoned.

TECHNICAL FIELD

The present invention relates to improved lithographic process for use in the manufacture of microelectronics.

BACKGROUND OF THE INVENTION

Lithographic processes are well known in the art for use in the manufacture of semiconductor devices. Lithography generally involves transferring a desired pattern, such as a circuit pattern, through a resist layer onto an underlying silicon substrate. The first step of the process generally involves forming a resist layer on the substrate layer. The resist layer is then exposed to patterned radiation to cause dissolution differentiation in the resist layer. The resist layer is then developed generally with liquid developer to form a positive tone or negative tone pattern in the resist layer. Negative tone images are very important in certain lithographic patterns, such as for microprocessors. The pattern is then transferred to the underlying silicon substrate with transfer techniques such as etching or ion implantation. However, there is in the industry environmental concerns with liquid developer waste streams. Processes for the dry development of the resist layer have been discovered. However, due to technical considerations, these processes have not been widely adopted in the industry.

There is also a desire in the industry for higher circuit density in microelectronics devices which are made using lithographic techniques. One method of increasing the number of components per chip is to decrease the minimum feature size on the chip, which requires higher lithographic resolution. There is a goal in the industry to reduce the feature size to below 0.20 microns. The use of shorter wavelength radiation (e.g., deep UV; e.g., 193) rather than the currently employed md-UV spectral range (e.g., 300–450 nm) offers the potential for this higher resolution. However, with deep UV radiation, fewer photons are transferred for the same energy dose and higher exposure doses are required to achieve the same desired photochemical response. Further, almost all art-known photoresists absorb strongly in the deep UV, making them unsuitable as resist materials. This problem has been, in some cases, avoided by the use of electron beam lithography. Electron beam lithography enables the use of resist materials which are opaque in the UV spectrum. However, e-beam lithography has associated problems of scattering with associated image distortion, which have not yet been resolved.

Nishikawa, U.S. Pat. No. 4,944,837, discloses lithographic imaging of polymethyl methacrylate (PMMA) resist with an electron beam and development of a positive tone image by removal of resist material degraded by e-beam exposure with supercritical fluid. Although Nishikawa has addressed environmental concerns associated with resist liquid development, resolution and image distortion are still of concern.

It is therefore an object of the present invention to provide an improved lithographic process for negative tone images using deep UV light which provides improved resolution and images without environmental issues.

Other objects and advantages will become apparent from the following disclosure.

SUMMARY OF THE INVENTION

The present invention relates to a process for generating a negative tone resist image comprising the steps of (1) coating a substrate with a film of a polymeric composition which is soluble in critical fluid, (2) imagewise exposing the film to radiation to insolubilize the exposed portion of the film, and (3) developing the image with critical fluid.

In a preferred embodiment, the polymeric composition comprises (i) a polymer, (ii) a photosensitive acid generator, and (iii) acid labile groups. The acid labile groups can be pendant from the polymer backbone or on a molecule dispersed in the polymer. Upon exposure to acid, the acid labile groups undergo a polarity change which results in dissolution differentiation.

A more thorough disclosure of the present invention is presented in the of detailed description which follows.

DETAILED DESCRIPTION OF THE INVENTION

The present invention relates to an improved process for generating a negative tone resist image on a substrate. The first step of the process of the present invention involves coating on a substrate a polymeric film comprising a polymer, a photosensitive acid generator, and acid labile groups.

The first component of the polymeric film is a polymer which is soluble in the critical development fluid. As used herein, soluble in critical fluid shall mean removal (dissolving) of a 1 micron film from a substrate in less than 1 hour, preferably less than 15 minutes, and more preferably less than 5 minutes. Suitable polymers included halogenated (fluorinated) polymers and polymers having alkylsiloxy substituents. The halogenated polymer is preferably a fluorinated polymer (e.g., homopolymer or copolymer). Suitable halogenated polymers for use in the process of the present invention include fluorinated polyalkylmethacrylate (e.g., polymethylmethacrylate), fluorinated polyalkylacrylate (wherein alkyl is $C_1$–$C_6$), and fluorinated styrene. Suitable polymers having alkylsiloxy substituents include polydimethylsiloxyalkylmethacrylate. Other suitable polymers will be known to those skilled in the art. The polymer will generally have a number average molecular weight of about 5,000 to about 50,000, and preferably be relatively transparent in the deep UV.

In one embodiment of the present invention, the polymer comprises acid labile groups pendant from the polymer backbone. The polymer is soluble in critical fluid. In one embodiment, upon imagewise exposure to radiation, the photogenerated acid converts the acid labile group to insoluble polar functionality, thereby enabling negative image development of the film with the critical fluid. In another embodiment, the photogenerated acid cleaves the acid labile, solubilizing (in critical fluid) group. The cleaved groups are then removed (e.g., thermally) from the polymer film, rendering the exposed portions of the film insoluble.

Preferred acid labile groups pendant from the polymer backbone are acid-cleavable groups such as acid-cleavable ester groups. Upon exposure to photogenerated acid, the side chain acid-cleavable groups pendant from the polymer backbone are cleaved to form polar recurring units on the polymer backbone which are insoluble in the critical developer fluid.

A preferred polymer for use in the process of the present invention is a copolymer formed by the reaction of two or more monomers.

A first monomer is selected from alkyl acrylate, alkyl methacrylate, or mixtures thereof. Various types of alkyl esters of these monomer can be used to synthesize the copolymer. Preferably, the ester substituent is halogenated, preferably fluorinated. Suitable ester substituents include fluorinated straight chain alkyl substituents and fluorinated alicyclic substituents such as pentafluoroethyl and pentafluoropropyl. In an alternative embodiment, the ester substituent is an alkylsiloxy substituent

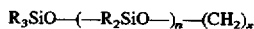

wherein R is hydrido or lower $C_1$-$C_6$ alkyl and n is 1–10 and x is 1–5). The second monomer is selected from alkyl acrylate, alkyl methacrylate, or mixtures thereof where the ester group is add labile to provide acid-sensitive ester groups pendant on the copolymer backbone. The preferred add labile pendant groups are organic ester groups which undergo a cleavage reaction in the presence of an acid. Preferred ester groups are teriary alkyl esters such as t-butyl and α-methyl benzyl esters of carboxylic acids. Cleavable ester groups can optionally be fluorinated to make them solubilizing in critical fluid. Other suitable add labile groups include t-butylcarbonates of phenols, tetrahydropyranyl or furanyl ether, trimethylsilyl or t-butyl(dimethyl)silyl ether, and t-butoxycarbonylmethyl ether of phenol. However, it is understood that a wide range of acid labile groups are operative in the process of the present invention such as those disclosed in Ito et al., U.S. Pat. No. 4,491,628, the disclosure of which is incorporated herein by reference. Brunsvold et al., U.S. Pat. Nos. 4,931,379 and 4,939,070, disclose suitable thermally-stable add labile groups and associated polymer resists and the disclosure of Brunsvold is also incorporated herein by reference.

Preferred monomers useful in the practice of the present invention include the t-butyl esters of acrylates and methacrylates. The monomer with the acid labile ester group, in combination with the radiation-sensitive acid generator, contributes radiation sensitivity to the composition. The copolymer may also comprise other monomers known to those skilled in the art to provide other desirable properties to the resist such as etch resistance, adhesion, glass transition, and the like.

The copolymer of the present invention will generally comprise about 40–80 mole % (preferably about 70 mole %) of the first monomer component, and about 20–60 mole % (preferably about 30 mole %) of the second monomer component. The copolymer can be synthesized by standard free radical solution polymerization techniques known by those skilled in the art.

In an alternative embodiment, the acid labile group can be attached to a molecule which is blended with a polymer. Suitable molecules having the acid labile group include t-butyl carbonates of bisphenol A and androstane-17-alkylcarboxylate (ester of cholic add), preferably the mono-, di-, or tri-protected hydroxy androstane-17-alkylcarboxylate. The protected hydroxy is a hydroxy substituent where hydrido is replaced with a nonphotoactive substituent such as lower ($C_{1-4}$) alkylcarbonyl such as methylcarbonyl, or lower ($C_{1-4}$) haloalkylcarbonyl such as trihalo (fluoro) methylcarbonyl. Suitable nonphotoactive protected hydroxy substituents are acetyl and preferably trifluoroacetyl. The androstane has 1 to 3 protected hydroxy substituents, preferably at the 3, 7, and 12 position, preferably at the 3 position. Specific preferred components are tertiary alkyl-(3-alkyl or haloalkyl carbonyl)lithocholate such as t-butyl 3-acetyllithocholate and t-butyl 3-trifluoroacetyllithocholate.

The third component of the film composition is a photosensitive acid generator. Upon exposure to radiation, the radiation-sensitive acid generator generates an acid. Suitable acid generators include triflates (e.g., triphenylsulfonium triflate or bis-(t-butyl phenyl) iodonium triflate), pyrogallol (e.g., trimesylate of pyrogallol), onium salts such as triarylsulfonium and diaryl iodonium hexafluorantimonates, hexafluoroarsenates, trifluoromethane sulfonates, perfluoro alkyl sulfonium iodonium salts, and others; trifluoromethanesulfonate esters of hydroxyimides, alpha-alpha'-bis-sulfonyl diazomethanes, sulfonate esters of nitro-substituted benzyl alcohols and napthoquinone-4-diazides and alkyl disulfones. Other suitable photoacid generators are disclosed in Allen's patent above and Reichmanis et al., *Chemistry of Materials*, Vol. 3, page 395, 1991, the disclosures of which are incorporated herein by reference.

The three-component composition preferably comprises about 1–3 weight % of the acid generator, about 10–30 weight % of the substituted androstane, about 60–90 weight % of the copolymer, more preferably about 2 weight % of the acid generator, about 20 weight % of the substituted androstane, and the remaining as copolymer.

The first step of the process involves coating the substrate with a film comprising the polymer, a photosensitive acid generator, and acid labile groups all dissolved in a suitable solvent. The resist film can be either a single layer or bilayer. Suitable substrates are comprised of silicon, ceramics, polymer, or the like. Suitable organic casting solvents include methyl cellosolve acetate, cyclohexanone, propylene glycol monomethyl ether acetate (PGMEA), and the like. Surprisingly, the compositions of the present invention comprising androstane with fluorinated protected hydroxy substituents have enhanced solubility in PGMEA, which is a standard solvent in the industry. Optionally, the film can contain additives such as plasticizers to lower the Tg of the polymer, and also polymers and small molecules to adjust the film's dissolution rate, etch resistance, optical density, radiation sensitivity, adhesion, and the like. The film can be coated on the substrate using art-known techniques such as spin or spray coating, doctor blading, or electrodeposition.

Preferably, before the film has been exposed to radiation, the film is heated to an elevated temperature of about 90°–150° C. for a short period of time of about 1 minute. The dried film suitably has a thickness of about 0.5–5.0 microns, preferably about 0.6–1.2 microns.

In the second step of the process, the film is imagewise exposed to radiation, suitably electromagnetic, preferably electromagnetic radiation such as deep ultraviolet or X-ray, more preferably deep ultraviolet radiation suitably at a wavelength of about 190–250 nm (248/254 nm), preferably 193 nm. Suitable radiation sources include mercury, mercury/xenon, xenon lamps, and X-ray. The preferred radiation source is ArF excimer or KrF excimer. Conveniently, due to the enhanced radiation sensitivity of the film, a film (0.75 micron thickness) is fully exposed with less than about 10–50 mJ/cm² of radiation, preferably less than about 20–40 mJ/cm², more preferably less than about 30 mJ/cm². The radiation is absorbed by the radiation-sensitive acid generator to generate free acid which converts the acid labile group to insoluble polar functionality.

After the film has been exposed to radiation, it is preferably heated to an elevated temperature, preferably at least about 80° to about 150° C. for 0.5 to 5 minutes, more preferably about 120° C. for 1 minute. The elevated temperature functions to enhance the acid catalyzed cleavage of the acid labile pendant group.

The last step of the process of the present invention involves development of the image in the film with critical fluid. A critical fluid, as used herein, is one or more substances heated to a temperature near or above its critical temperature $T_c$ and compressed to a pressure near or above its critical pressure $P_c$ to achieve miscibility with no phase separation. As used herein, a temperature near or above the $T_c$ will be a temperature greater than about 15° C. below the $T_c$. As used herein, a pressure near or above $P_c$ will be a pressure greater than about 10 atmosphere below the $P_c$. Preferably, the critical fluid is at or above the $T_c$ and at or above the $P_c$. For a critical fluid comprising one substance, there is miscibility between the liquid and gas phase of such a substance. For critical fluids comprising two or more substances, there is miscibility between the two liquids and the two gases of such substances. Suitable substances for use with the process of the present invention include carbon dioxide, ammonia, difluorodichloromethane, methane, ethane, and propane. Other suitable substances will be known to those skilled in the art.

To develop the film, the film is placed in a pressure vessel and critical fluid is passed through the vessel over the film. The fluid selectively dissolves the soluble unexposed portion of the film to give a negative tone image. The process enables the development of the film without contamination of the resist with organic developers.

The critical fluid is then recycled by flowing out of the vessel through a pressure-reduction valve to drop the pressure and temperature of the fluid (e.g., to ambient), thereby resulting in reduced solubility and precipitation of the dissolved film material from the fluid. The spent critical fluid in the form of liquid/gas is then recycled by reheating and compressing the fluid.

The present invention also relates to an integrated circuit made by the process of the present invention such as a circuit chip, circuit board, or semiconductor device comprising a circuit formed on a substrate made by the steps of the process of the present invention.

After the substrate has been exposed by the development process of the present invention, circuits can be formed on the exposed areas of the substrate by coating the substrate with a conductive material such as conductive metals by art-known techniques such as evaporation, sputtering, chemical vapor deposition, or laser-induced deposition. Dielectric materials may also be deposited by similar means during the process of making circuits. Inorganic ions such as boron, phosphorous, or arsenic can be implanted in the substrate in the process for making p or n doped circuit transistors. Other means for forming circuits will be known by those skilled in the art.

The following example is a detailed description of the process of the present invention. The detailed preparation falls within the scope of, and serves to exemplify, the more generally described method set forth above. The example is presented for illustrative purposes only, and is not intended as a restriction on the scope of the invention.

EXAMPLE

A 75/25 (mole %) copolymer of pentafluoropropyl methacrylate-t-butyl methacrylate was formulated into a resist by adding the solvent propylene glycol methylether acetate to give a 20 weight % polymer solution, and adding 1 percent (by weight v. polymer) of the photoacid generator bis-(t-butyl phenyl) iodonium triflate. The solution was spin coated on a silicon wafer and baked at 140° C. for 1 minute to yield a 0.75 micron film. This resist composition is extremely transparent at 193 nm (A=0.08) and 248 nm (A≦0.1), and thus can be fully exposed (through the thickness of the film) at both wavelengths. The film was exposed at 250 nm through a mask using an exposure dosage of 20 mJ/cm². The film was then post-exposed baked at 140° C. for 1 minute. The exposed wafer was developed in critical $CO_2$ at 4,000 psi pressure and 80° C. The wafers were in contact with the critical fluid developer for 10 minutes. The unexposed portion of the film is completely dissolved and the exposed portion is insoluble, thereby forming negative tone image.

Although this invention has been described with respect to specific embodiments, the details thereof are not to be construed as limitations for it will be apparent that various embodiments, changes, and modifications may be resorted to without departing from the spirit and scope thereof, and it is understood that such equivalent embodiments are intended to be included within the scope of this invention.

What is claimed is:

1. A process for generating a negative tone resist image comprising the steps of:
   (a) coating a substrate with a polymeric film comprising:
      (i) a polymer having pendant acid labile groups, the polymer is a halogenated polymer or a polymer having a pendant alkylsiloxy ester substituent or a pendant halogenated alkyl ester substituent, and
      (ii) a photosensitive acid generator,
   (b) imagewise exposing the film to radiation to generate free acid; and
   (c) developing the negative tone image with carbon dioxide critical fluid.

2. The process of claim 1 wherein the polymer is a fluorinated polymer.

3. The process of claim 2 wherein the film is exposed to ultraviolet radiation at about 193 to about 254 nm.

4. The process of claim 3 wherein the polymer is selected from fluorinated polyalkymethacrylate or fluorinated polyalkylacrylate.

5. The process of claim 4 wherein the film is exposed to radiation at about 193 nm.

6. The process of claim 1 wherein the polymer is polyalkylsiloxy alkylmethacrylate or polyalkylsiloxy alkylacrayate.

* * * * *